(12) United States Patent
Nakamura

(10) Patent No.: US 12,143,737 B2
(45) Date of Patent: Nov. 12, 2024

(54) PHOTOELECTRIC CONVERTER, PHOTOELECTRIC CONVERSION SYSTEM, AND MOVING BODY

(71) Applicant: CANON KABUSHIKI KAISHA, Tokyo (JP)

(72) Inventor: Kohichi Nakamura, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/590,887

(22) Filed: Feb. 2, 2022

(65) Prior Publication Data
US 2022/0247958 A1    Aug. 4, 2022

(30) Foreign Application Priority Data

Feb. 4, 2021   (JP) ................ 2021-016891

(51) Int. Cl.
| | |
|---|---|
| H04N 25/75 | (2023.01) |
| H01L 27/146 | (2006.01) |
| H03M 3/00 | (2006.01) |
| H04N 25/616 | (2023.01) |
| H04N 25/79 | (2023.01) |

(52) U.S. Cl.
CPC ....... *H04N 25/75* (2023.01); *H01L 27/14634* (2013.01); *H03M 3/50* (2013.01); *H04N 25/616* (2023.01); *H04N 25/79* (2023.01)

(58) Field of Classification Search
CPC ...... H04N 25/616; H04N 25/75; H04N 25/79; H01L 27/14634; H03M 3/50
See application file for complete search history.

(56) References Cited

U.S. PATENT DOCUMENTS

| | | |
|---|---|---|
| 8,451,360 B2 | 5/2013 | Nakamura et al. |
| 8,598,901 B2 | 12/2013 | Hiyama et al. |
| 8,836,838 B2 | 9/2014 | Nakamura et al. |
| 8,928,786 B2 | 1/2015 | Iwata et al. |
| 9,029,752 B2 | 5/2015 | Saito et al. |
| 9,083,906 B2 | 7/2015 | Nakamura et al. |
| 9,232,165 B2 | 1/2016 | Saito et al. |

(Continued)

FOREIGN PATENT DOCUMENTS

| | | |
|---|---|---|
| JP | 2017-103771 A | 6/2017 |
| JP | 2020-096225 A | 6/2020 |

(Continued)

OTHER PUBLICATIONS

U.S. Appl. No. 17/590,007, filed Feb. 1, 2022 (First Named Inventor: Tetsuya Itano).

(Continued)

*Primary Examiner* — Lin Ye
*Assistant Examiner* — Chriss S Yoder, III
(74) *Attorney, Agent, or Firm* — Venable LLP

(57) ABSTRACT

A photoelectric converter includes a structure in which a first substrate and a second substrate are stacked, wherein a pixel array including a plurality of pixels is arranged on the first substrate, and at least part of a sample-and-hold circuit configured to sample and hold a signal output from the pixel array is arranged on the first substrate, and wherein at least part of a delta-sigma AD converter configured to convert an analog signal output from the sample-and-hold circuit into a digital signal is arranged on the second substrate.

20 Claims, 17 Drawing Sheets

(56) References Cited

U.S. PATENT DOCUMENTS

| | | |
|---|---|---|
| 9,438,828 B2 | 9/2016 | Itano et al. |
| 9,602,752 B2 | 3/2017 | Kobayashi et al. |
| 9,602,753 B2 | 3/2017 | Saito et al. |
| 9,966,398 B2 | 5/2018 | Nakamura et al. |
| 11,115,608 B2 | 9/2021 | Sakai et al. |
| 2013/0221197 A1* | 8/2013 | Shimotsusa ............ H04N 5/33 250/206 |
| 2014/0077063 A1* | 3/2014 | Cho ................ H01L 27/14618 257/443 |
| 2016/0227141 A1 | 8/2016 | Kobayashi et al. |
| 2019/0253654 A1* | 8/2019 | Kuroda ................ H01L 27/146 |
| 2020/0265909 A1* | 8/2020 | Matsuura ............... H04N 25/75 |

FOREIGN PATENT DOCUMENTS

| | | |
|---|---|---|
| JP | 2020-191543 A | 11/2020 |
| WO | 2019/069614 A1 | 4/2019 |
| WO | 2020/122010 A1 | 6/2020 |

OTHER PUBLICATIONS

U.S. Appl. No. 17/590,895, filed Feb. 2, 2022 (First Named Inventor: Kazuhiro Saito).

U.S. Appl. No. 17/693,597, filed Mar. 14, 2022 (First Named Inventor: Tetsuya Itano).

\* cited by examiner

FIG. 2
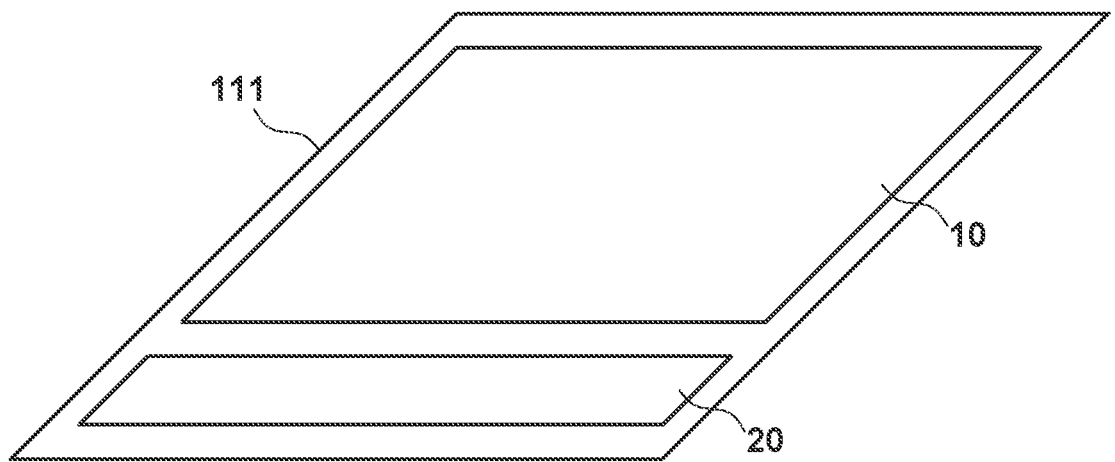
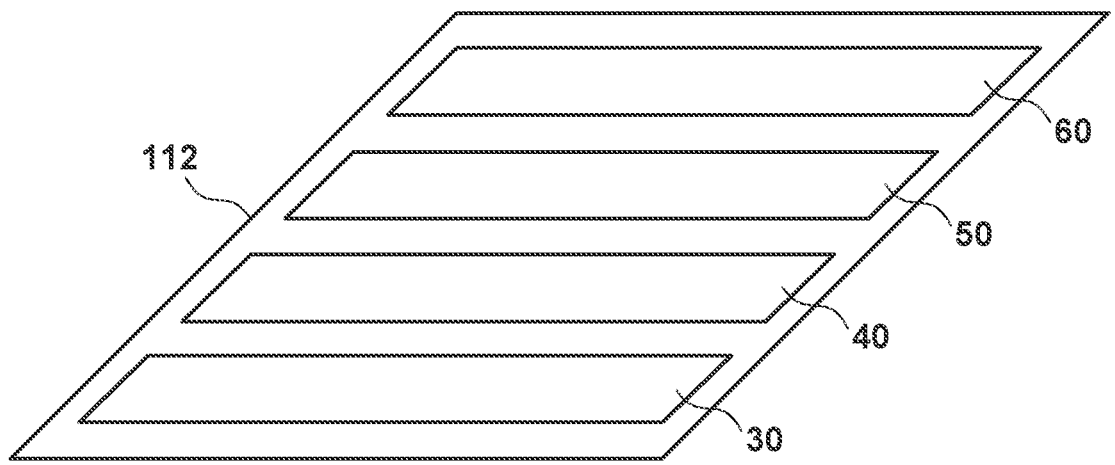

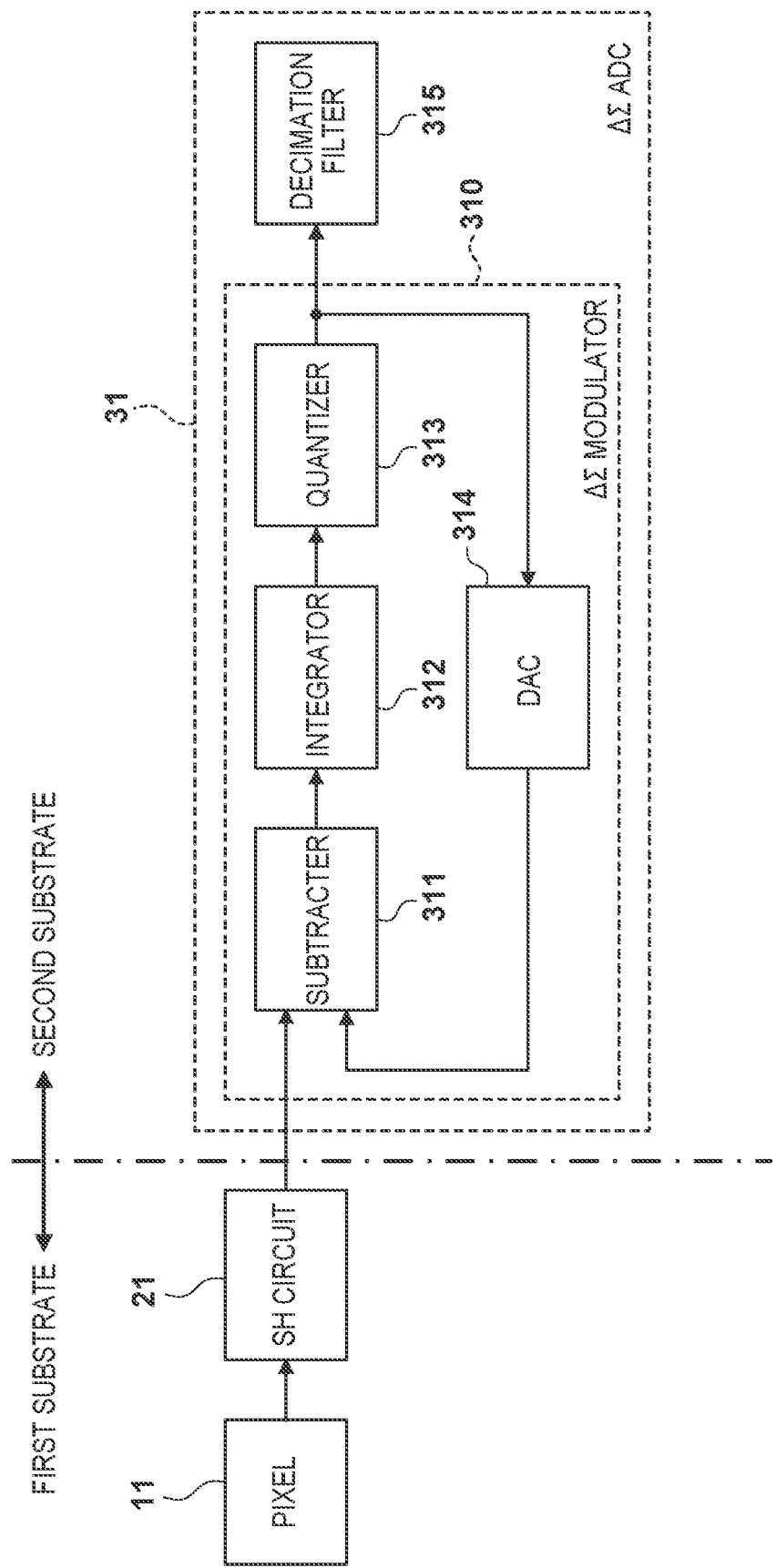

FIG. 10
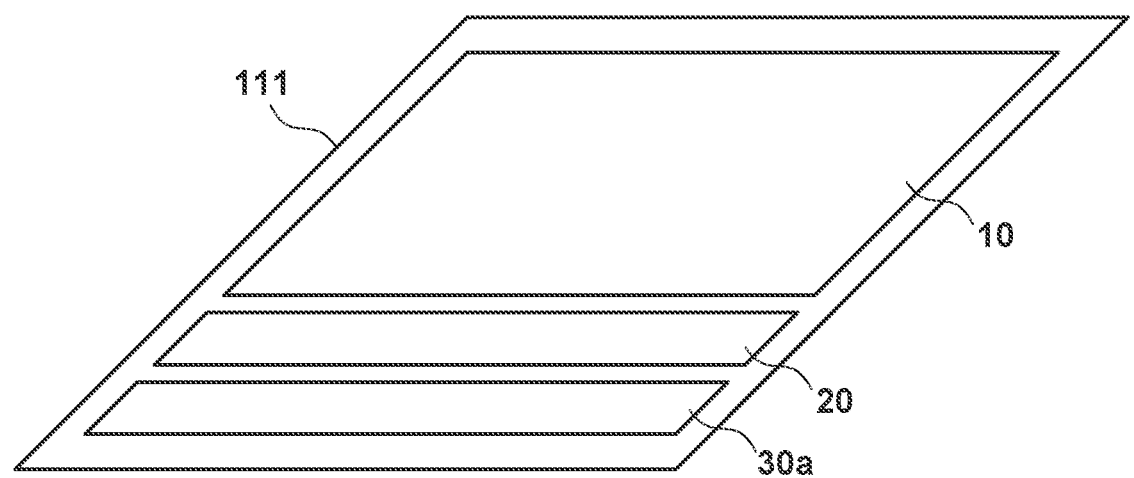
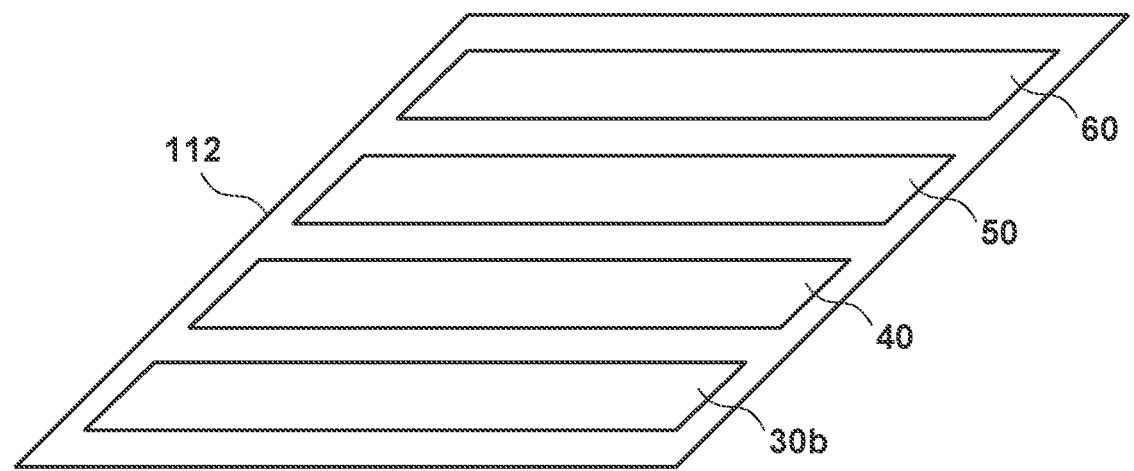

FIG. 13
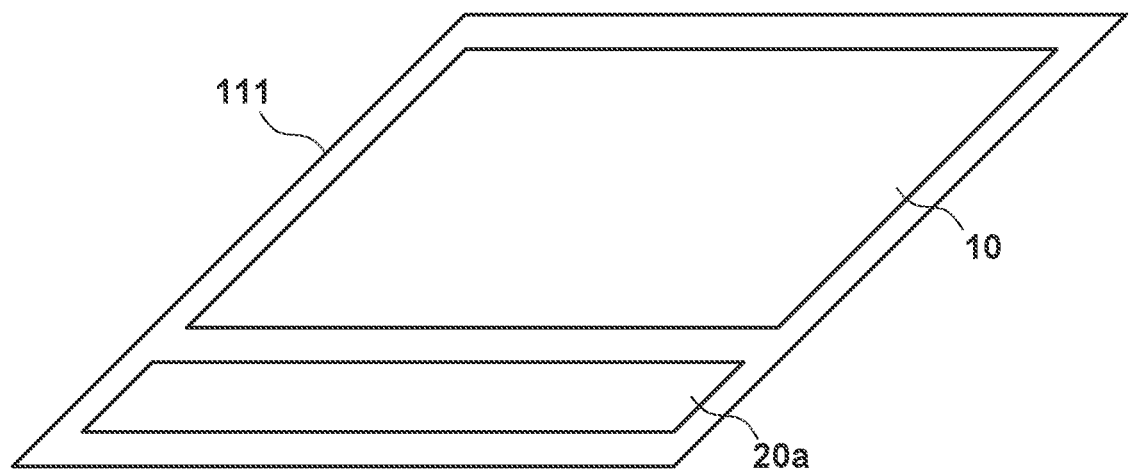
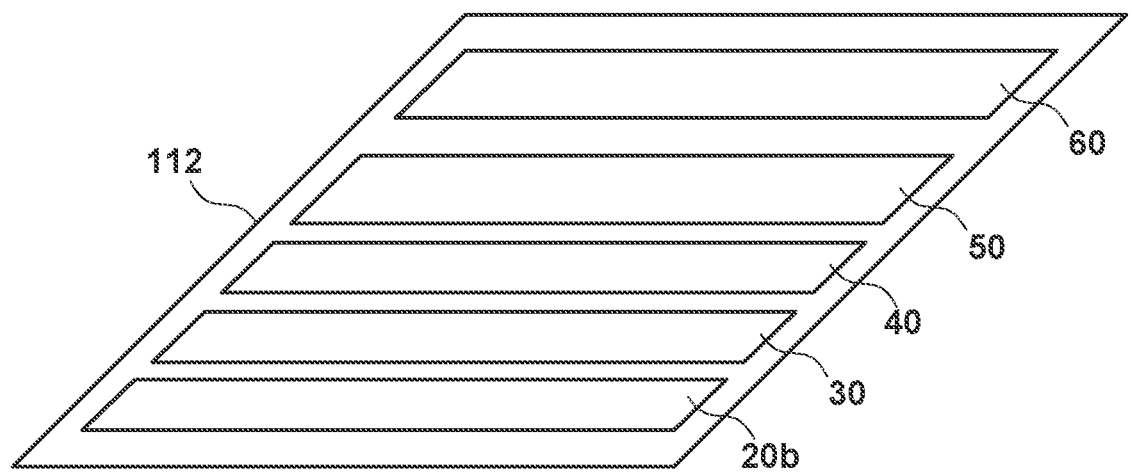

PHOTOELECTRIC CONVERTER, PHOTOELECTRIC CONVERSION SYSTEM, AND MOVING BODY

BACKGROUND OF THE INVENTION

Field of the Invention

The present invention relates to a photoelectric converter, a photoelectric conversion system, and a moving body.

Description of the Related Art

International Publication No. 2019/069614 describes an image sensor in which the first semiconductor substrate and the second semiconductor substrate are stacked. A pixel array unit is arranged on the first semiconductor substrate, and a row selection unit, a load MOS unit, a sample-and-hold unit, an analog-digital conversion unit, a memory unit, a data processor, an output unit, a timing control unit, and the like are arranged on the second semiconductor substrate. The analog-digital conversion unit is, for example, a delta-sigma analog-digital converter (delta-sigma AD converter). The delta-sigma AD converter includes the first integrator, the second integrator, a quantizer, and a decimation filter.

Since the delta-sigma AD converter includes a digital circuit that operates at high speed, it may generate unallowable noise. This noise may influence a circuit arranged on the substrate on which the delta-sigma AD converter is arranged, especially, the sample-and-hold unit that processes an analog signal.

SUMMARY OF THE INVENTION

The present invention provides a technique advantageous in reducing the influence on a sample-and-hold circuit by noise generated by a delta-sigma AD converter.

One of aspects of the present invention provides a photoelectric converter comprising a structure in which a first substrate and a second substrate are stacked, wherein a pixel array including a plurality of pixels is arranged on the first substrate, and at least part of a sample-and-hold circuit configured to sample and hold a signal output from the pixel array is arranged on the first substrate, and wherein at least part of a delta-sigma AD converter configured to convert an analog signal output from the sample-and-hold circuit into a digital signal is arranged on the second substrate.

Further features of the present invention will become apparent from the following description of exemplary embodiments with reference to the attached drawings.

BRIEF DESCRIPTION OF THE DRAWINGS

FIG. 2 is a view exemplifying the arrangement of a plurality of elements forming the photoelectric converter according to the embodiment;

FIG. 4 is a block diagram showing the first arrangement example of a delta-sigma AD converter for one column;

FIG. 10 is a view showing another example of the arrangement of the plurality of elements forming the photoelectric converter according to the embodiment;

FIG. 13 is a view showing still another example of the arrangement of the plurality of elements forming the photoelectric converter according to the embodiment;

DESCRIPTION OF THE EMBODIMENTS

Figure 1:
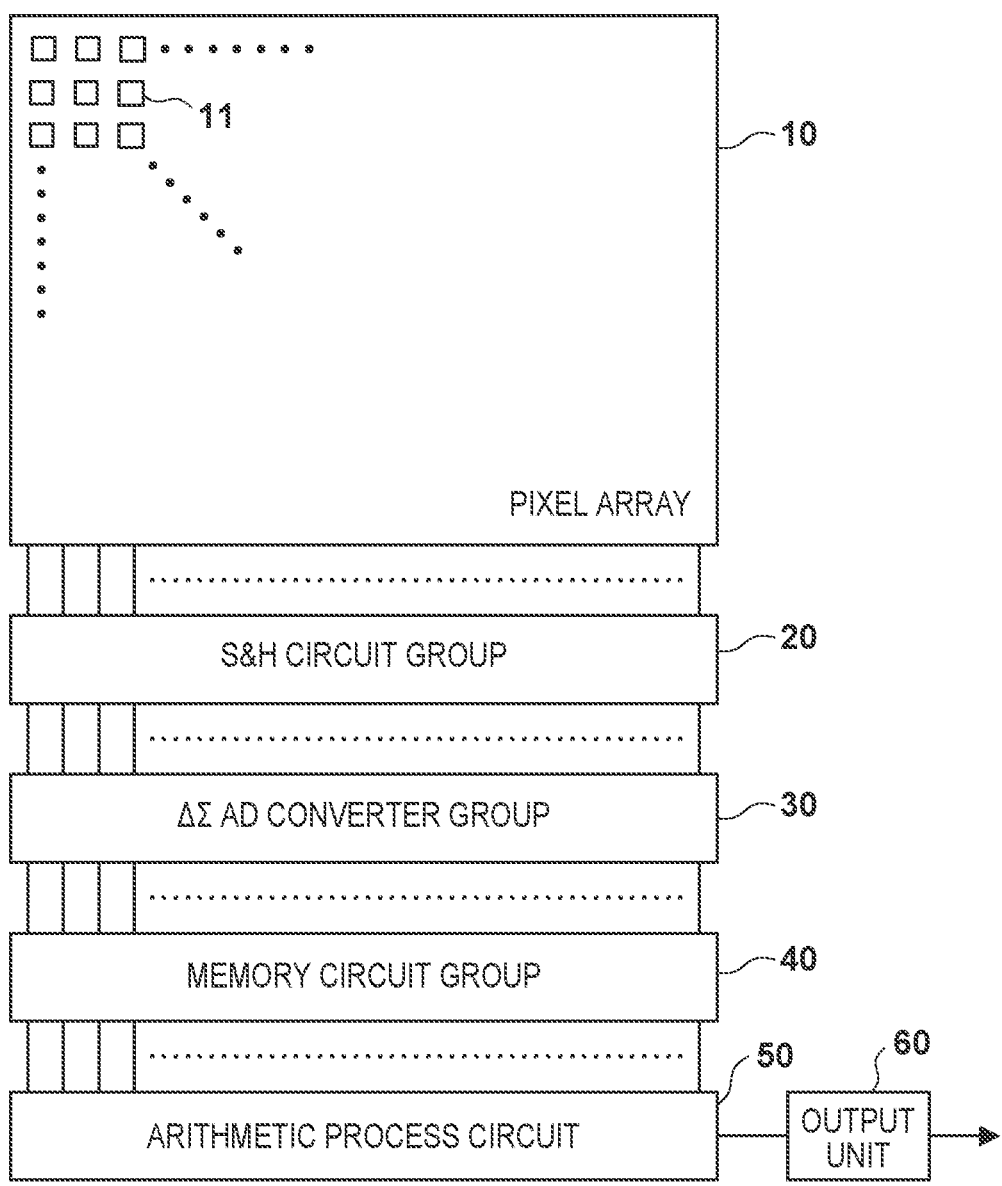
FIG. 1 is a block diagram showing the arrangement of a photoelectric converter according to an embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1 shows the arrangement of a photoelectric converter 1 according to an embodiment. The photoelectric converter 1 can be formed as an image sensor or an image capturing device. From another viewpoint, the photoelectric converter 1 can be configured to capture an image and output, to an external device, for example, a storage device, processing device, display device, or a communication device, the captured image or information or an image obtained by processing the captured image.

The photoelectric converter 1 can include a pixel array 10 including a plurality of pixels 11, and a sample-and-hold circuit group 20 that samples and holds signals output from the pixel array 10. The photoelectric converter 1 can further include a delta-sigma AD converter group 30 that converts analog signals output from the sample-and-hold circuit group 20 into digital signals. The photoelectric converter 1 may include a memory circuit group 40 that stores the digital signals output from the delta-sigma AD converter group 30. In addition, the photoelectric converter 1 can include an arithmetic processing circuit (processor) 50 that processes at least one of the digital signals output from the delta-sigma AD converter group 30 and the signals stored in the memory circuit group 40 and obtains processed information (for example, an image). The photoelectric converter 1 can include an output unit 60 that outputs at least one of the digital signals output from the delta-sigma AD converter group 30, the signals stored in the memory circuit group 40, and the information obtained by the processing of the arithmetic processing circuit 50. The arithmetic processing circuit 50 may be configured to supply, to the output unit 60, in a predetermined order, the signals output from the delta-sigma AD converter group 30 and stored in the memory circuit group 40.

FIG. 2 exemplifies the arrangement of a plurality of elements forming the photoelectric converter 1. The photoelectric converter 1 can have a structure in which a first substrate 111 and a second substrate 112 are stacked. The concept of the structure in which the first substrate 111 and the second substrate 112 are stacked includes a structure in which at least one other substrate is stacked in addition to the first substrate 111 and the second substrate 112. On the first substrate 111, the pixel array 10 is arranged and at least part of the sample-and-hold circuit group 20 (some sample-and-hold circuits) can be arranged. On the second substrate 112, at least part of the delta-sigma AD converter group 30 (some delta-sigma AD converters) can be arranged. On the second substrate 112, all or some of the memory circuit group 40, the arithmetic processing circuit 50, and the output unit 60 can be arranged. In one example of the arrangement, the pixel array 10 and the sample-and-hold circuit group 20 are arranged on the first substrate 111, and the delta-sigma AD converter group 30, the memory circuit group 40, the arithmetic processing circuit 50, and the output unit 60 are arranged on the second substrate 112.

Figure 3A:
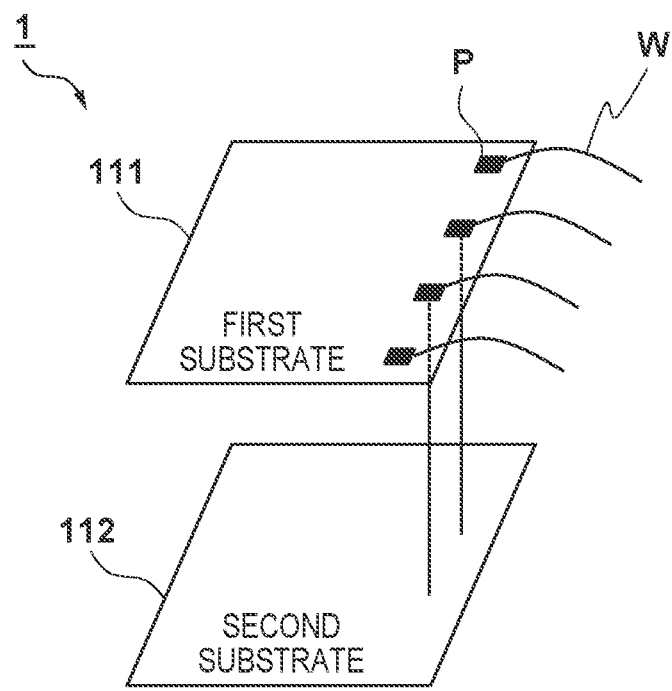
FIGS. 3A and 3B are views each exemplifying the supply form of a power supply voltage and a ground voltage to the photoelectric converter according to the embodiment.
Figure 3B:
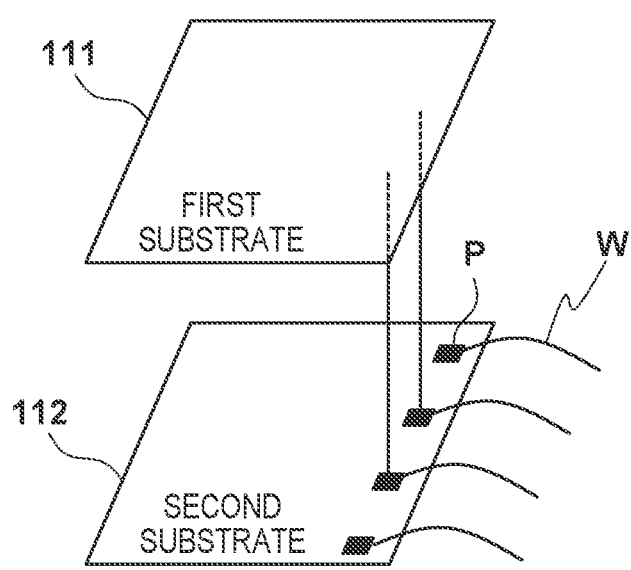

FIGS. 3A and 3B each exemplify the supply form of a power supply voltage and a ground voltage to the photoelectric converter 1. The power supply voltage can include a plurality of different voltages. In the example shown in FIG. 3A, pads P are provided on the first substrate 111, and the power supply voltage or the ground voltage is supplied, to each pad P, via each wire W, from each pin (not shown) provided in a package that seals the first substrate 111 and the second substrate 112. In the example shown in FIG. 3A, the voltage supplied to the pad P of the first substrate 111 is supplied to the second substrate 112 via bonding provided between the first substrate 111 and the second substrate 112. A signal output from the second substrate 112, for example, a signal output from the output unit 60 is supplied to the first substrate 111 via bonding provided between the first substrate 111 and the second substrate 112, and output via the pad P provided on the first substrate 111. Furthermore, a signal supplied from the outside can be received by the pad P of the first substrate 111 and supplied to the circuit of the first substrate 111, and can also be supplied to the circuit of the second substrate 112 via bonding, as needed. In the example shown in FIG. 3A, no pads P are arranged on the second substrate 112.

In the example shown in FIG. 3B, the pads P are provided on the second substrate 112, and the power supply voltage or the ground voltage is supplied, to each pad P, via each wire W, from each pin (not shown) provided in the package that seals the first substrate 111 and the second substrate 112. In the example shown in FIG. 3B, the voltage supplied to the pad P of the second substrate 112 is supplied to the first substrate 111 via bonding provided between the first substrate 111 and the second substrate 112. Furthermore, a signal supplied from the outside can be received by the pad P of the second substrate 112 and supplied to the circuit of the first substrate 111 via bonding, and can also be supplied to the circuit of the second substrate 112. In the example shown in FIG. 3B, no pads P are arranged on the first substrate 111.

FIG. 4 shows the first arrangement example of a delta-sigma AD converter 31 and a sample-and-hold circuit 21 for one column. The plurality of pixels 11 forming one column of the pixel array 10 are represented by one pixel 11. The sample-and-hold circuit group 20 includes the plurality of sample-and-hold circuits 21 corresponding to the plurality of columns of the pixel array 10, respectively, and the delta-sigma AD converter group 30 includes the plurality of delta-sigma AD converters 31 corresponding to the plurality of columns of the pixel array 10, respectively. Each delta-sigma AD converter 31 can include a delta-sigma modulator 310 and a decimation filter 315. As exemplified in FIG. 4, the delta-sigma modulator 310 and the decimation filter 315 can be arranged on the second substrate 112. From another viewpoint, the overall delta-sigma AD converter 31 (delta-sigma AD converter group 30) can be arranged on the second substrate 112.

Since the delta-sigma AD converter 31 (delta-sigma AD converter group 30) includes a number of elements that perform a switching operation, it may generate noise accordingly. The pixel 11 and the sample-and-hold circuit 21 are analog circuits and are readily influenced by noise. Therefore, to reduce the influence on the pixel 11 by noise generated by the delta-sigma AD converter 31, it is advantageous to arrange the delta-sigma AD converter 31 (delta-sigma AD converter group 30) on the second substrate 112 different from the first substrate 111 on which the pixel 11 (pixel array 10) is arranged. Furthermore, to reduce the influence on the sample-and-hold circuit 21 by noise generated by the delta-sigma AD converter 31, it is advantageous to arrange the delta-sigma AD converter 31 on the second substrate 112 different from the first substrate 111 on which the sample-and-hold circuit 21 is arranged.

The delta-sigma modulator 310 can include, for example, a subtracter 311, an integrator 312, a quantizer 313, and a digital-analog converter 314. The subtracter 311 calculates the difference between a signal supplied from the sample-and-hold circuit 21 and a signal supplied from the digital-analog converter 314, and supplies the difference to the integrator 312. The integrator 312 integrates the signal supplied from the subtracter 311, and supplies the integration result to the quantizer 313. The quantizer 313 quantizes the integration result supplied from the integrator 312. More specifically, the quantizer 313 can quantize the integration result, that is, perform conversion into a 1-bit digital signal by comparing the integration result supplied from the integrator 312 with a predetermined reference voltage. The decimation filter 315 is a kind of digital low-pass filter, and converts the 1-bit digital signal output from the quantizer 313 into a digital signal of a plurality of bits by decimation processing.

Figure 5:
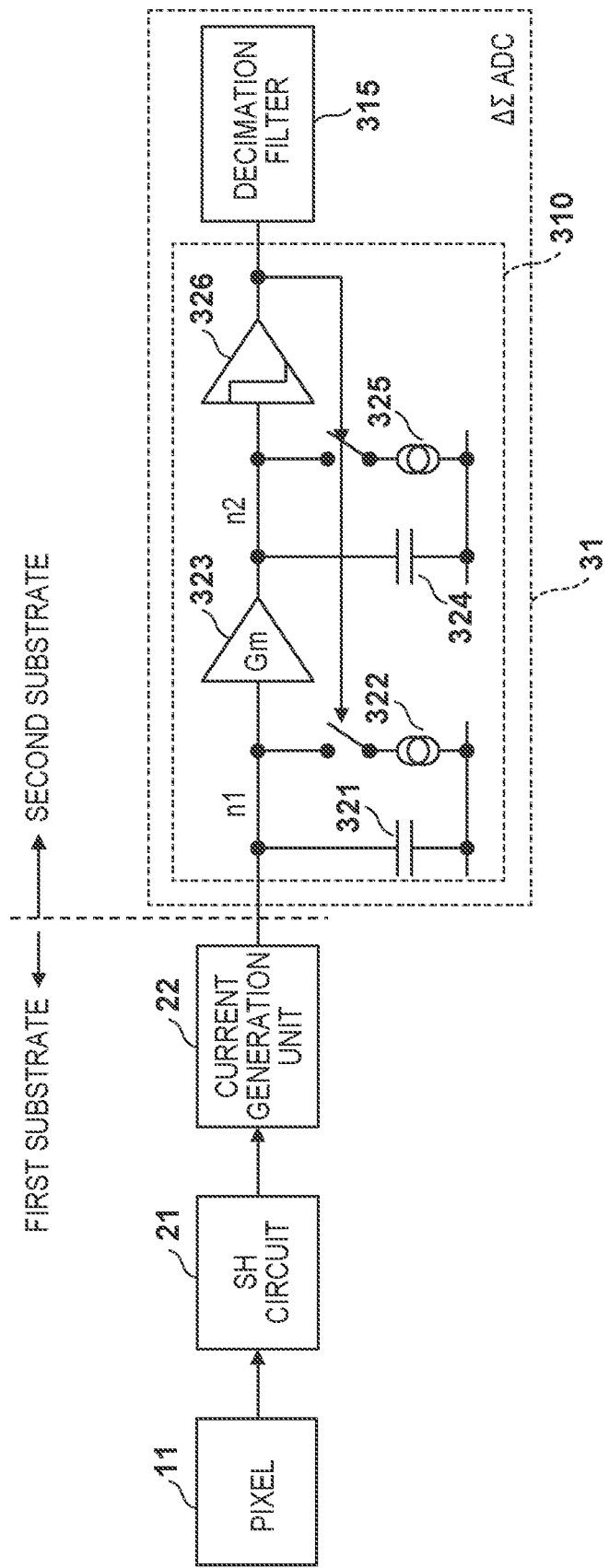
FIG. 5 is a block diagram showing the second arrangement example of the delta-sigma AD converter for one column.

FIG. 5 shows the second arrangement example of the delta-sigma AD converter 31 for one column. A current generation unit 22 that converts a voltage supplied from the sample-and-hold circuit 21 into a current can be provided between the sample-and-hold circuit 21 and the delta-sigma AD converter 31. The current generation unit 22 may be understood as part of the sample-and-hold circuit 21. The plurality of pixels 11 forming one column of the pixel array 10 are represented by one pixel 11. The delta-sigma AD converter 31 can include the delta-sigma modulator 310 and the decimation filter 315.

The delta-sigma modulator 310 can include a first integrator 321, a voltage-current converter 323, a second integrator 324, a quantizer 326, a first digital-analog converter 322, and a second digital-analog converter 325. The first integrator 321 integrates a current supplied to an input node n1 of the delta-sigma modulator 310. The voltage-current converter 323 converts the voltage of the input node n1 into a current. The second integrator 324 integrates a current supplied to an intermediate node n2 connected to the output of the voltage-current converter 323. The quantizer 326 quantizes the voltage of the intermediate node n2. The first digital-analog converter 322 extracts a predetermined current from the input node n1 in accordance with the output from the quantizer 326. The second digital-analog converter 325 extracts a predetermined current from the intermediate node n2 in accordance with the output from the quantizer 326. The decimation filter 315 and at least part of the circuit including the first integrator 321, the voltage-current converter 323, the second integrator 324, the quantizer 326, the first digital-analog converter 322, and the second digital-analog converter 325 can be arranged on the second substrate 112. In the example shown in FIG. 5, the first integrator 321, the voltage-current converter 323, the second integrator 324, the quantizer 326, the first digital-analog converter 322, and the second digital-analog converter 325 as well as the decimation filter 315 are arranged on the second substrate 112.

Figure 6A:
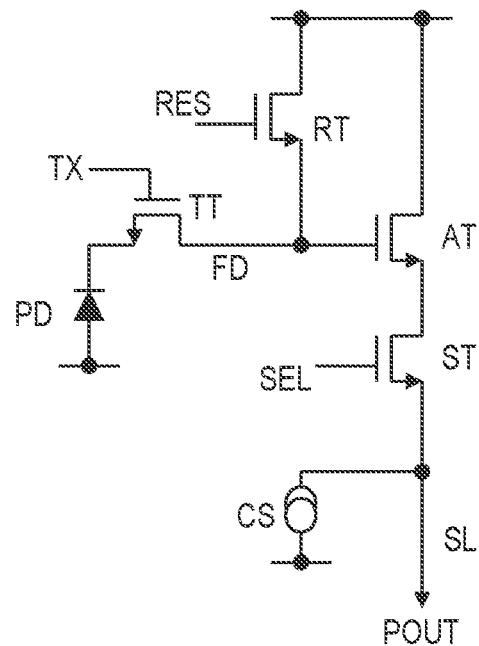
FIG. 6A is a circuit diagram showing an example of the arrangement of a pixel.
Figure 6B:
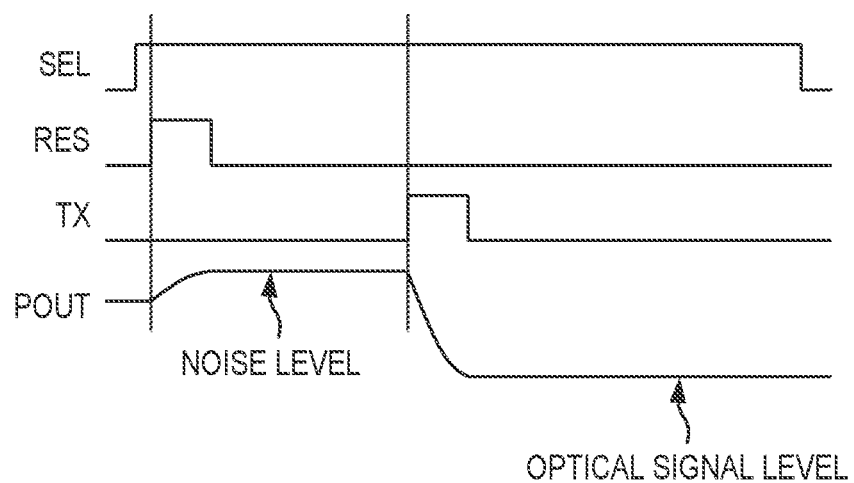
FIG. 6B is a timing chart showing an example of the operation of the pixel.

FIG. 6A shows an example of the arrangement of the pixel 11, and FIG. 6B shows an example of the operation of the pixel 11. The pixel 11 can include a photoelectric conversion element PD, a floating diffusion FD, and a transfer transistor TT that transfers, to the floating diffusion FD, charges generated in the photoelectric conversion element PD and accumulated in the accumulation unit of the photoelectric conversion element PD. Furthermore, the pixel 11 can include a reset transistor RT that resets the voltage of the floating diffusion FD, and an amplification transistor AT that outputs a voltage corresponding to the voltage of the floating diffusion FD to a vertical signal line SL. The vertical signal line SL is connected to a current source CS, and the amplification transistor AT can form a source follower circuit. The sample-and-hold circuit 21 can sample and hold the voltage or signal output to the vertical signal line SL. An amplification circuit may be arranged between the vertical signal line SL and a sample-and-hold circuit SH. Alternatively, the sample-and-hold circuit 21 may include an amplification circuit.

The pixel 11 may further include a selection transistor ST. The ON state of the selection transistor ST indicates selection of the pixel 11 including the selection transistor ST. When the selection transistor ST is turned on, an output from the amplification transistor AT is output to the vertical signal line SL. The transfer transistor TT, the reset transistor RT, and the selection transistor ST can be controlled by a vertical scanning circuit (not shown) via a transfer signal line TX, a reset signal line RES, and a selection signal line SEL, respectively. The vertical scanning circuit can be arranged on the first substrate 111.

FIG. 6B exemplifies the voltages of the selection signal line SEL, the reset signal line RES, the transfer signal line TX, and the vertical signal line SL as SEL, RES, TX, and POUT, respectively. In the example shown in FIGS. 6A and 6B, the active level of each of the selection signal SEL, the reset signal RES, and the transfer signal TX respectively supplied to the selection signal line SEL, the reset signal line RES, and the transfer signal line TX is high level. Note that reference symbols SEL, RES, and TX each denote both the signal line name and the signal name for the sake of convenience.

The voltage level appearing in the vertical signal line SL in a state in which the reset signal RES changes from high level to low level and reset by the reset transistor RT is canceled can be called a noise level. After that, when the transfer signal TX is set to high level, the transfer transistor TT transfers the charges of the photoelectric conversion element PD to the floating diffusion FD. This changes the voltage of the floating diffusion FD, and a voltage level corresponding to the voltage appears in the vertical signal line SL. This voltage level is called an optical signal level.

Figure 7:
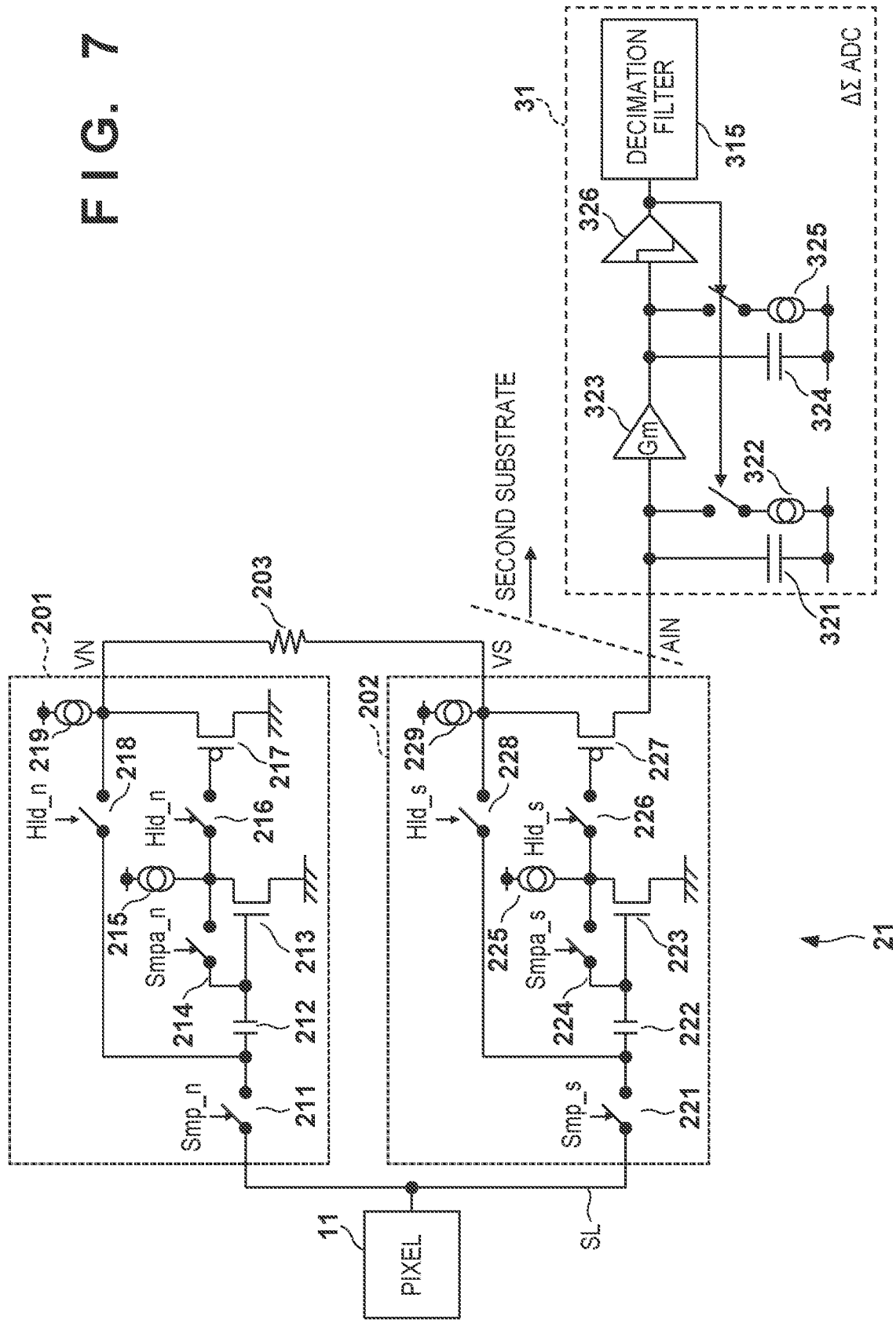
FIG. 7 is a circuit diagram showing an example of the arrangement of a sample-and-hold circuit.
Figure 8:
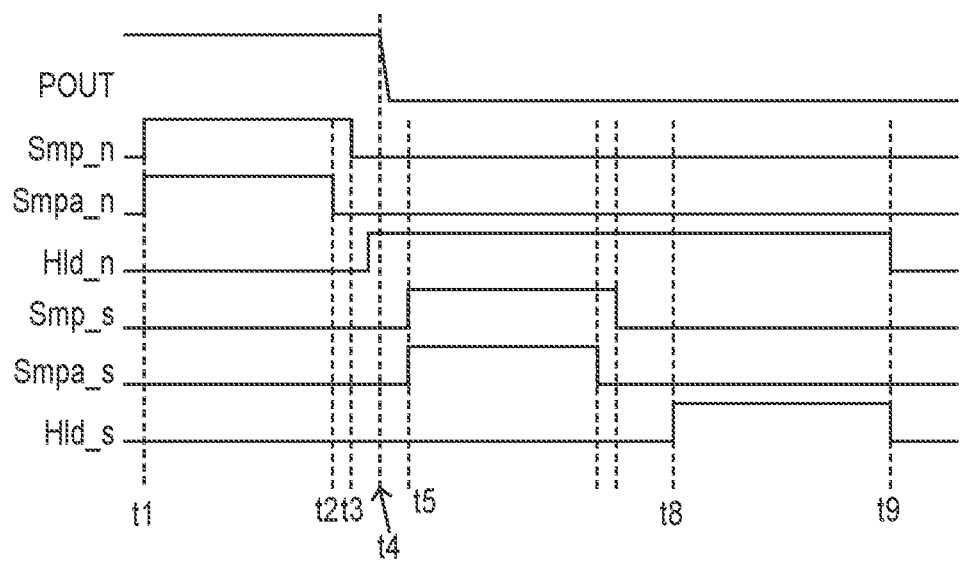
FIG. 8 is a timing chart showing an example of the operation of the sample-and-hold circuit shown in FIG. 7.

FIG. 7 shows an example of the arrangement of the sample-and-hold circuit 21. FIG. 8 shows an example of the operation of the sample-and-hold circuit 21 shown in FIG. 7. The sample-and-hold circuit 21 can include a first sample-and-hold circuit 201 that samples and holds the noise level supplied from the pixel 11, and a second sample-and-hold circuit 202 that samples and holds the optical signal level supplied from the pixel 11.

The first sample-and-hold circuit 201 and the second sample-and-hold circuit 202 can have the same arrangement. The first sample-and-hold circuit 201 can include switches 211 and 214 that are turned on/off in accordance with sample signals Smp_n and Smpa_n, respectively, and switches 216 and 218 that are turned on/off in accordance with a hold signal Hld_n. Furthermore, the first sample-and-hold circuit 201 can include a hold capacitor 212, amplification transistors 213 and 217, and current sources 215 and 219. A voltage corresponding to the sampled and held voltage (noise level) appears at an output terminal VN of the first sample-and-hold circuit 201.

The second sample-and-hold circuit 202 can include switches 221 and 224 that are turned on/off in accordance with sample signals Sms_n and Smsa_n, respectively, and switches 226 and 228 that are turned on/off in accordance with a hold signal Hld_s. Furthermore, the second sample-and-hold circuit 202 can include a hold capacitor 222, amplification transistors 223 and 227, and current sources 225 and 229. A voltage corresponding to the sampled and held voltage (optical signal level) appears at an output terminal VS of the second sample-and-hold circuit 202.

The sample-and-hold circuit 21 includes a resistive element 203 that connects the output terminals VN and VS. A difference current corresponding to the difference between the noise level and the optical signal level flows during a period from t8 to t9 in FIG. 8. The difference current corresponds to the net optical signal level obtained by subtracting the noise level from the optical signal level. A current obtained by summing up the difference signal and the current (constant value) flowing from the current source 229 can be supplied to an input terminal AIN of the delta-sigma AD converter 31.

Figure 9:
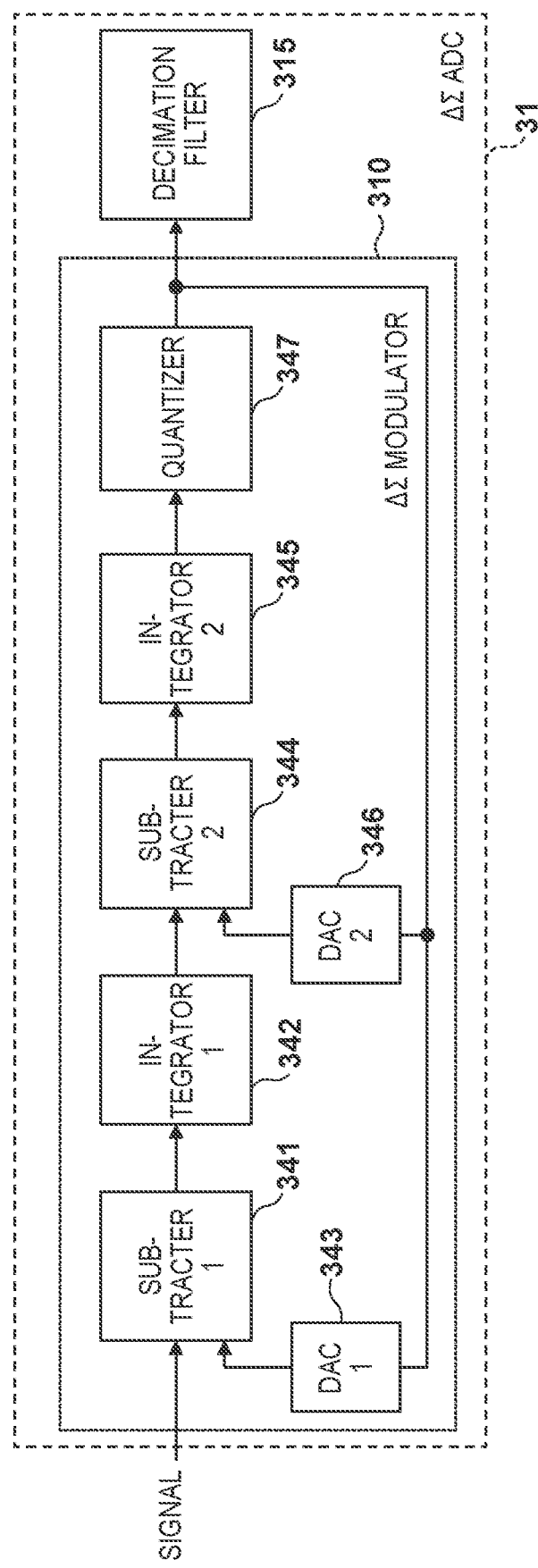
FIG. 9 is a block diagram showing the third arrangement example of the delta-sigma AD converter for one column.

FIG. 9 shows the third arrangement example of the delta-sigma AD converter 31 for one column. The plurality of pixels 11 forming one column of the pixel array 10 are represented by one pixel 11. The delta-sigma AD converter 31 can include the delta-sigma modulator 310 and the decimation filter 315.

The delta-sigma modulator 310 can include a first subtracter 341, a first integrator 342, a second subtracter 344, a second integrator 345, a quantizer 347, a first digital-analog converter 343, and a second digital-analog converter 346. The first subtracter 341 outputs the difference between a signal supplied to the delta-sigma AD converter 31 and an output from the first digital-analog converter 343. The first integrator 342 integrates the output from the first subtracter 341. The second subtracter 344 outputs the difference between the output from the first integrator 342 and an output from the second digital-analog converter 346. The second integrator 345 integrates the output from the second subtracter 344. The quantizer 347 quantizes the output from the second integrator 345. Each of the first digital-analog converter 343 and the second digital-analog converter 346 DA-converts an output from the quantizer 347.

The decimation filter 315 and at least part of the circuit including the first subtracter 341, the first integrator 342, the second subtracter 344, the second integrator 345, the quantizer 347, the first digital-analog converter 343, and the second digital-analog converter 346 can be arranged on the second substrate 112. In one example, the first subtracter 341, the first integrator 342, the second subtracter 344, the second integrator 345, the quantizer 347, the first digital-analog converter 343, and the second digital-analog converter 346 as well as the decimation filter 315 can all be arranged on the second substrate 112.

FIG. 10 shows another example of the arrangement of the plurality of elements forming the photoelectric converter 1. The delta-sigma AD converter group 30 includes a first portion 30a and a second portion 30b. The first portion 30a can be arranged on the first substrate 111, and the second portion 30b can be arranged on the second substrate 112. In other words, some of the delta-sigma AD converters 31 constituting the delta-sigma AD converter group 30 can be arranged on the first substrate 111 and the remaining delta-sigma AD converters 31 can be arranged on the second substrate 112. The delta-sigma AD converters 31 may be divisionally arranged on the first substrate 111 and the second substrate 112 or on more substrates. From another viewpoint, noise generated by the first portion 30a of the delta-sigma AD converter group 30 is smaller than that generated by the second portion 30b.

Figure 11:
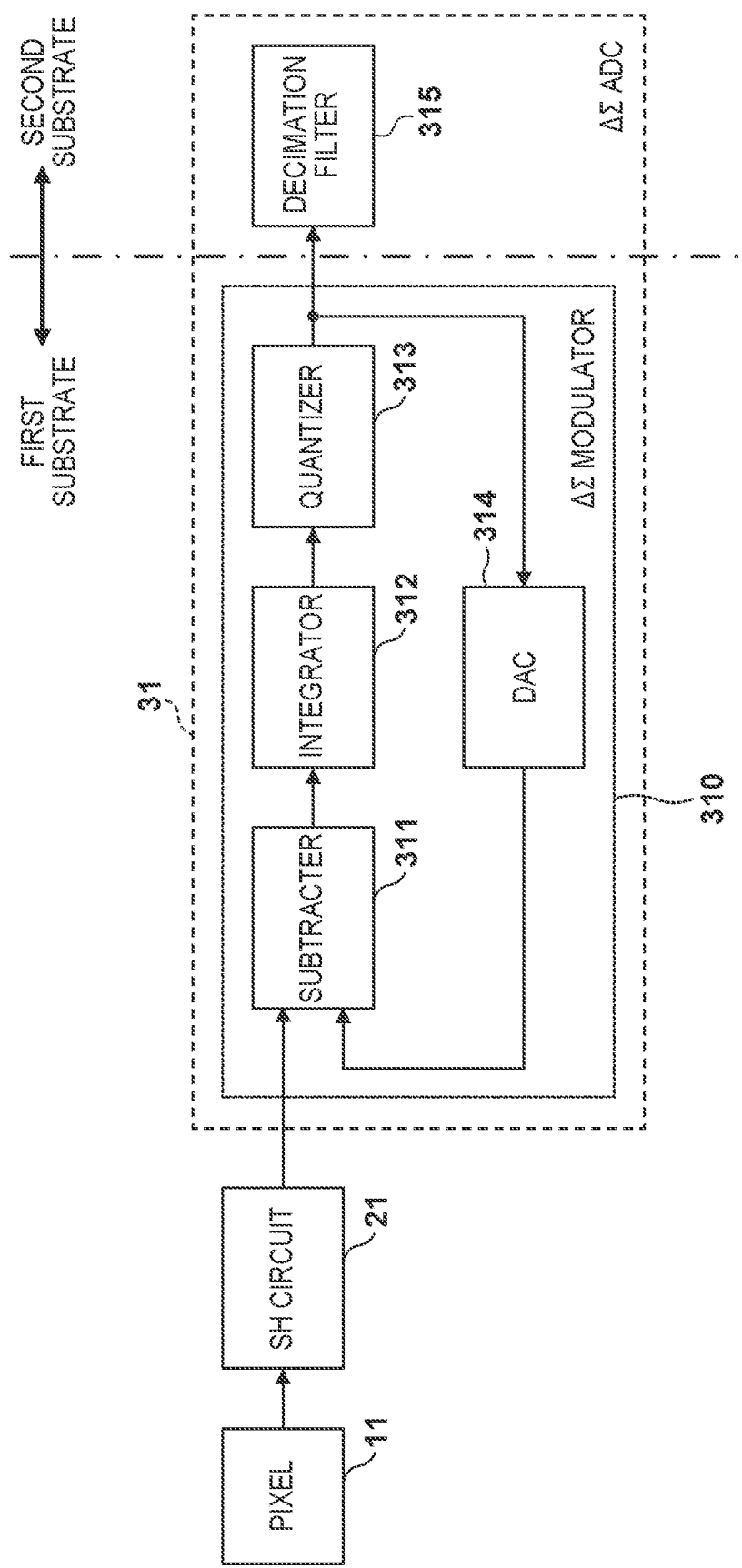
FIG. 11 is a block diagram showing an example of the division form of a plurality of elements forming the delta-sigma AD converter.

FIG. 11 shows an example of the division form of the plurality of elements forming the delta-sigma AD converter 31. The delta-sigma AD converter 31 includes the delta-sigma modulator 310 and the decimation filter 315. The delta-sigma modulator 310 can be arranged on the first substrate 111 and the decimation filter 315 can be arranged on the second substrate 112. The decimation filter 315 may generate noise the most among the plurality of elements forming the delta-sigma AD converter 31. Noise generated by the decimation filter 315 can also influence the operation of the delta-sigma modulator 310. Therefore, arranging the delta-sigma modulator 310 on the first substrate 111 and arranging the decimation filter 315 on the second substrate 112 can contribute to improvement of the accuracy of AD conversion. The maximum voltage supplied to the decimation filter 315 arranged on the second substrate 112 may be lower than that supplied to the delta-sigma modulator 310 arranged on the first substrate 111. Furthermore, a single power supply voltage can be supplied to the second substrate 112. One kind of power supply voltage can be supplied to the second substrate 112.

Figure 12:
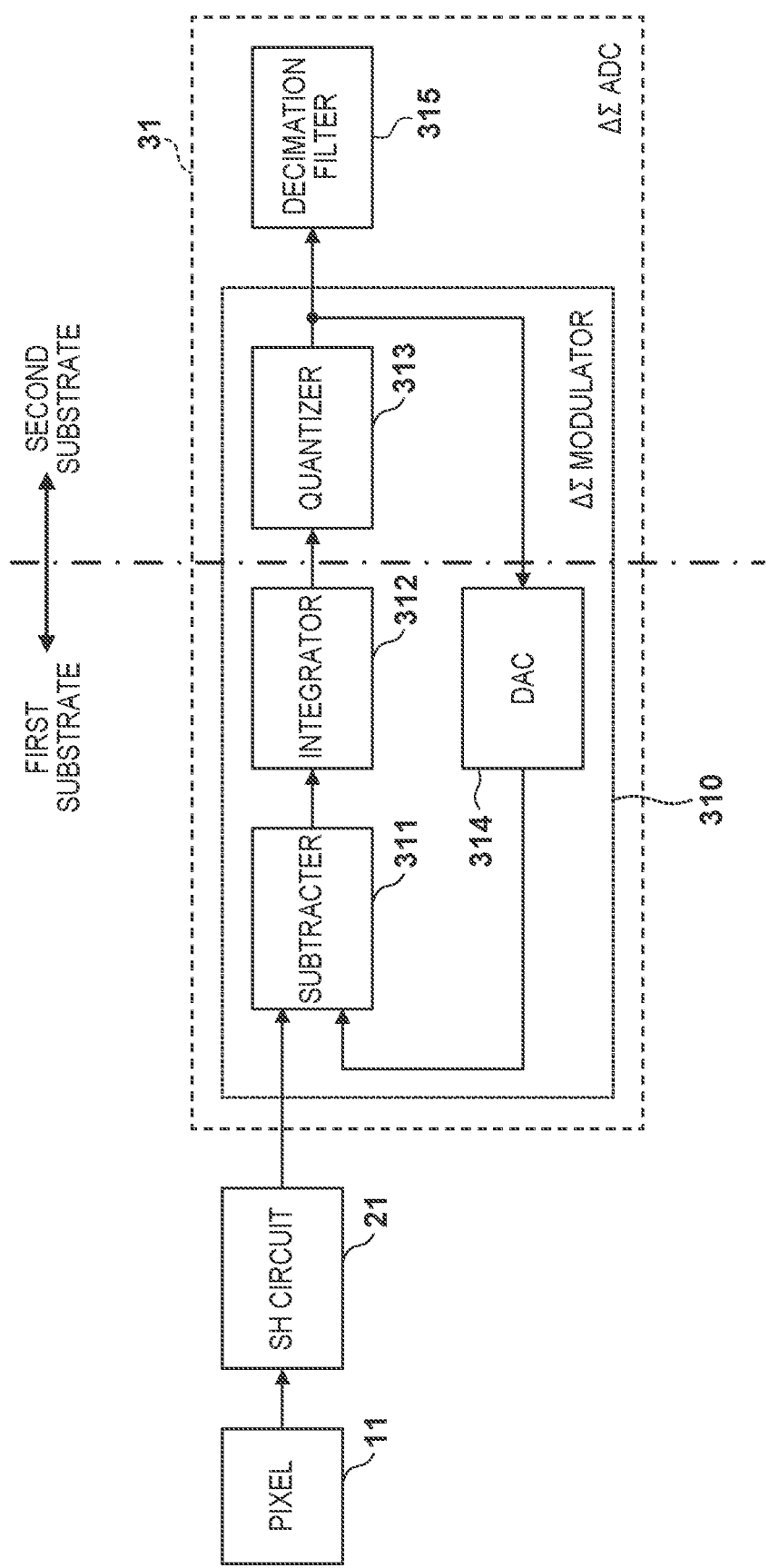
FIG. 12 is a block diagram showing another example of the division form of the plurality of elements forming the delta-sigma AD converter.

FIG. 12 shows another example of the division of the elements forming the delta-sigma AD converter 31. The delta-sigma AD converter 31 includes the delta-sigma modulator 310 and the decimation filter 315. The delta-sigma modulator 310 can include, for example, the subtracter 311, the integrator 312, the quantizer 313, and the digital-analog converter 314. Among the constituent elements of the modulator 310, the quantizer 313 and the decimation filter 315 can be arranged on the second substrate 112. Among the constituent elements of the modulator 310, the remaining constituent elements, for example, the subtracter 311, the integrator 312, and the digital-analog converter 314 can be arranged on the first substrate 111.

The decimation filter 315 and the quantizer 313 may generate noise the most among the plurality of elements forming the delta-sigma AD converter 31. Noise generated by the decimation filter 315 and the quantizer 313 can also influence the operations of the subtracter 311, the integrator 312, and the digital-analog converter 314. Therefore, arranging, on the second substrate 112, the quantizer 313 and the decimation filter 315 among the constituent elements of the modulator 310 and arranging, on the first substrate 111, the remaining constituent elements among the constituent elements of the modulator 310 can contribute to improvement of the accuracy of AD conversion. The maximum voltage supplied to the decimation filter 315 and the quantizer 313 arranged on the second substrate 112 may be lower than that supplied to the constituent elements of the delta-sigma modulator 310 arranged on the first substrate 111. Furthermore, a single power supply voltage can be supplied to the second substrate 112. One kind of power supply voltage can be supplied to the second substrate 112.

FIG. 13 shows still another example of the arrangement of the plurality of elements forming the photoelectric converter 1. The sample-and-hold circuit group 20 includes a first portion 20a and a second portion 20b. The first portion 20a can be arranged on the first substrate 111, and the second portion 20b can be arranged on the second substrate 112. In other words, some of the sample-and-hold circuits 21 constituting the sample-and-hold circuit group 20 can be arranged on the first substrate 111, and the remaining sample-and-hold circuits 21 can be arranged on the second substrate 112. The sample-and-hold circuits 21 may be divisionally arranged on the first substrate 111 and the second substrate 112 or on more substrates. From another viewpoint, noise generated by the first portion 20a of the sample-and-hold circuit group 20 is smaller than that generated by the second portion 20b.

Figure 14A:
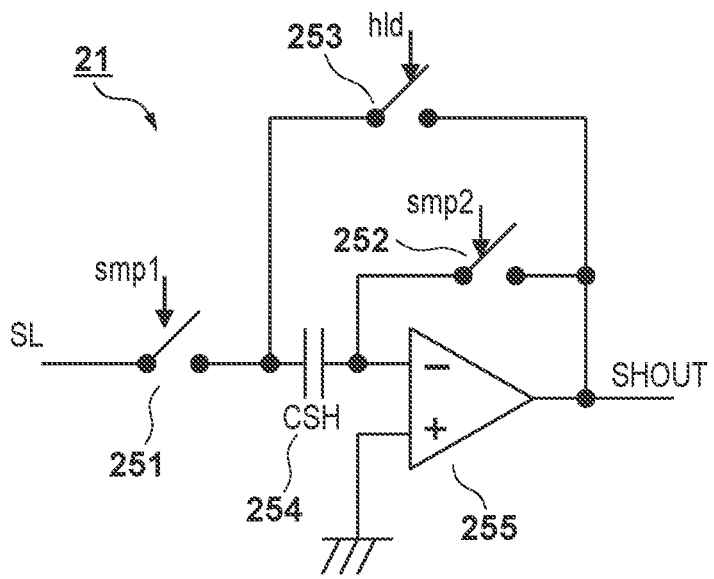
FIGS. 14A and 14B are a circuit diagram and a timing chart showing another example of the arrangement of the sample-and-hold circuit.
Figure 14B:
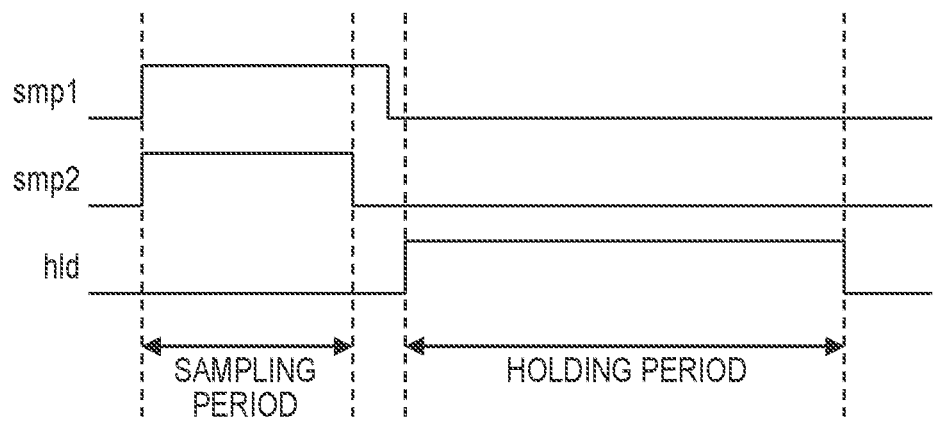

FIG. 14A shows another example of the arrangement of the sample-and-hold circuit 21. FIG. 14B shows an example of the operation of the sample-and-hold circuit 21 shown in FIG. 14A. The sample-and-hold circuit 21 shown in FIG. 14A includes switches 251, 252, 253, and 254, and a differential amplifier 255, which are connected as shown in FIG. 14A. A signal of the pixel 11 output to the vertical signal line SL is sampled and held by the sample-and-hold circuit 21, and supplied to the delta-sigma AD converter 31 from an output terminal SHOUT.

An example of a photoelectric conversion system using the photoelectric converter of the above-described embodiment will be described below.

Figure 15:
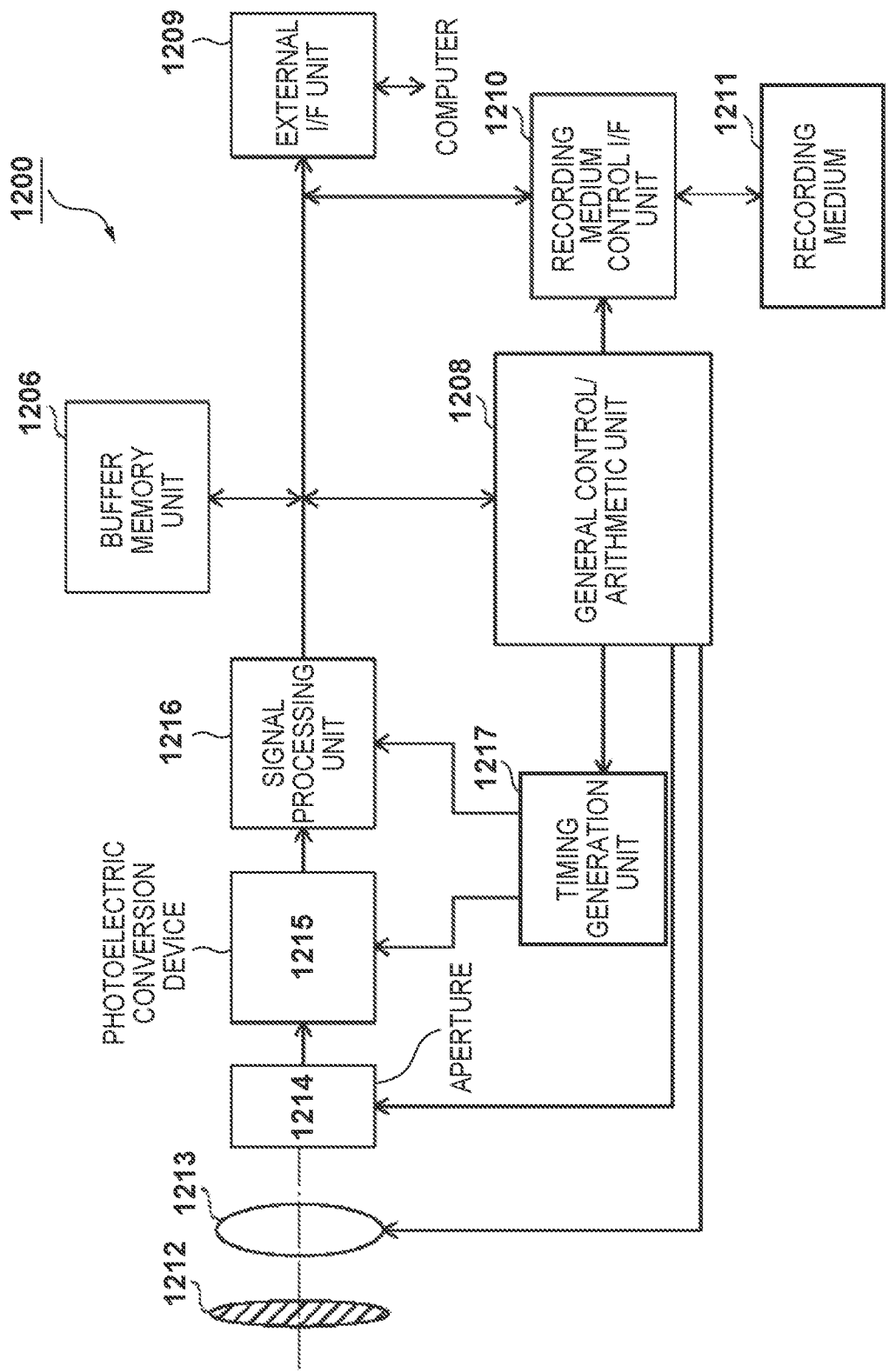
FIG. 15 is a block diagram showing the arrangement of a photoelectric conversion system according to the embodiment.

FIG. 15 is a block diagram showing the arrangement of a photoelectric conversion system 1200 according to this embodiment. The photoelectric conversion system 1200 according to this embodiment includes a photoelectric converter 1215. The photoelectric converter 1215 is the photoelectric converter 1 described in the above embodiment. The photoelectric conversion system 1200 can be used as, for example, an image capturing system. Practical examples of the image capturing system are a digital still camera, a digital camcorder, and a monitoring camera. FIG. 15 shows an example of a digital still camera as the photoelectric conversion system 1200.

The photoelectric conversion system 1200 shown in FIG. 15 includes the photoelectric converter 1215, a lens 1213 for forming an optical image of an object on the photoelectric converter 1215, an aperture 1214 for changing the amount of light passing through the lens 1213, and a barrier 1212 for protecting the lens 1213. The lens 1213 and the aperture 1214 form an optical system for concentrating light to the photoelectric converter 1215.

The photoelectric conversion system 1200 includes a signal processor 1216 for processing an output signal output from the photoelectric converter 1215. The signal processor 1216 performs an operation of signal processing of performing various kinds of correction and compression for an input signal, as needed, thereby outputting the resultant signal. The photoelectric conversion system 1200 further includes a buffer memory unit 1206 for temporarily storing image data and an external interface unit (external I/F unit) 1209 for communicating with an external computer or the like. Furthermore, the photoelectric conversion system 1200 includes a recording medium 1211 such as a semiconductor memory for recording or reading out image capturing data, and a recording medium control interface unit (recording medium control I/F unit) 1210 for performing a recording or readout operation in or from the recording medium 1211. The recording medium 1211 may be incorporated in the photoelectric conversion system 1200 or may be detachable. In addition, communication with the recording medium 1211 from the recording medium control I/F unit 1210 or communication from the external I/F unit 1209 may be performed wirelessly.

Furthermore, the photoelectric conversion system 1200 includes a general control/arithmetic unit 1208 that controls various kinds of operations and the entire digital still camera, and a timing generation unit 1217 that outputs various kinds of timing signals to the photoelectric converter 1215 and the signal processor 1216. In this example, the timing signal and the like may be input from the outside, and the photoelectric conversion system 1200 need only include at least the photoelectric converter 1215 and the signal processor 1216 that processes an output signal output from the photoelectric converter 1215. As described in the fourth embodiment, the timing generation unit 1217 may be incorporated in the photoelectric converter. The general control/arithmetic unit 1208 and the timing generation unit 1217 may be configured to perform some or all of the control functions of the photoelectric converter 1215.

The photoelectric converter 1215 outputs an image signal to the signal processor 1216. The signal processor 1216 performs predetermined signal processing for the image signal output from the photoelectric converter 1215 and outputs image data. The signal processor 1216 also generates an image using the image signal. Furthermore, the signal processor 1216 may perform distance measurement calculation for the signal output from the photoelectric converter 1215. Note that the signal processor 1216 and the timing generation unit 1217 may be incorporated in the photoelectric converter. That is, each of the signal processor 1216 and the timing generation unit 1217 may be provided on a substrate on which pixels are arranged or may be provided on another substrate. An image capturing system capable of acquiring a higher-quality image can be implemented by forming an image capturing system using the photoelectric converter of the above-described embodiment.

Figure 16A:
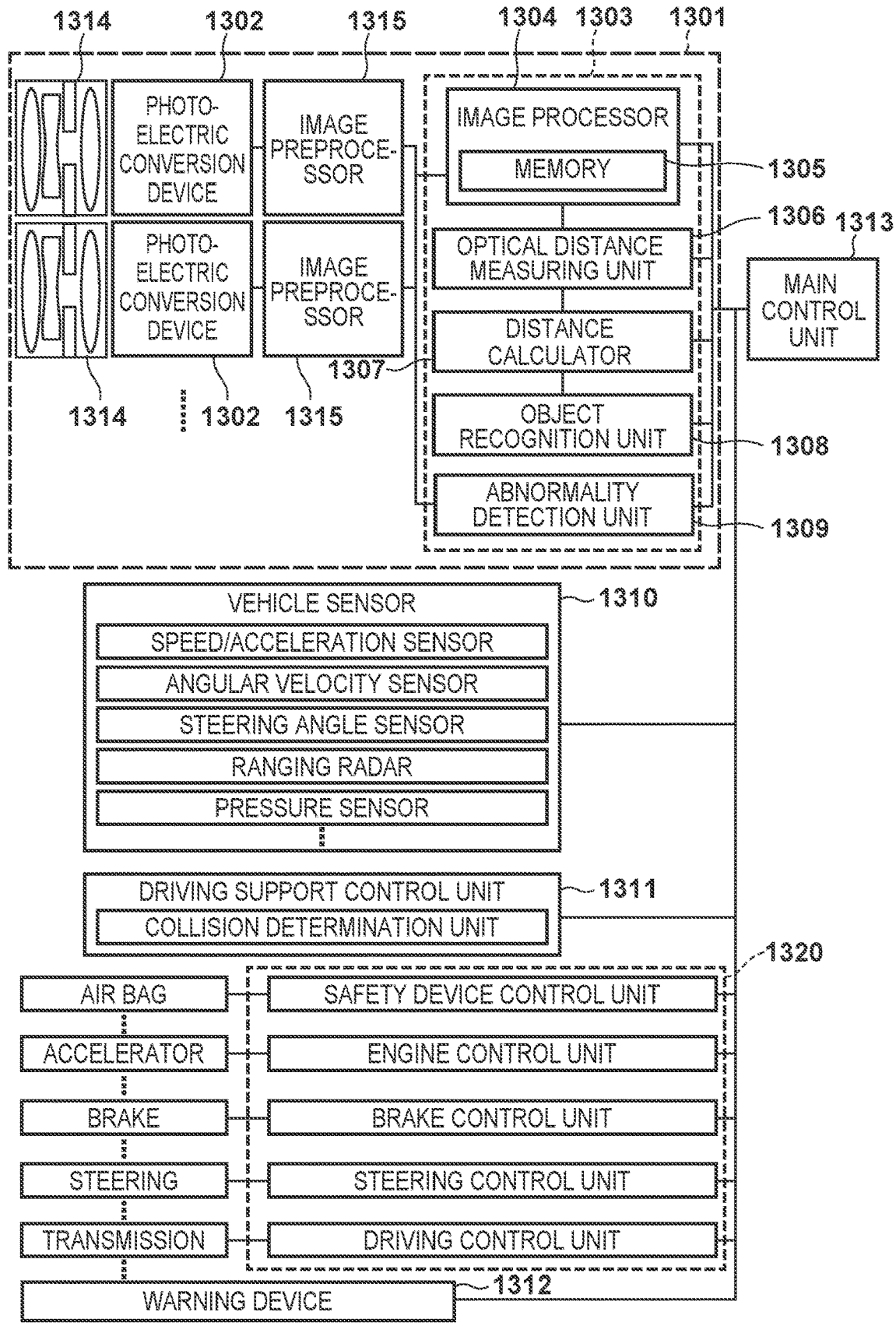
FIGS. 16A and 16B are a block diagram and a view showing the arrangement of a photoelectric conversion system and a moving body according to the embodiment.
Figure 16B:
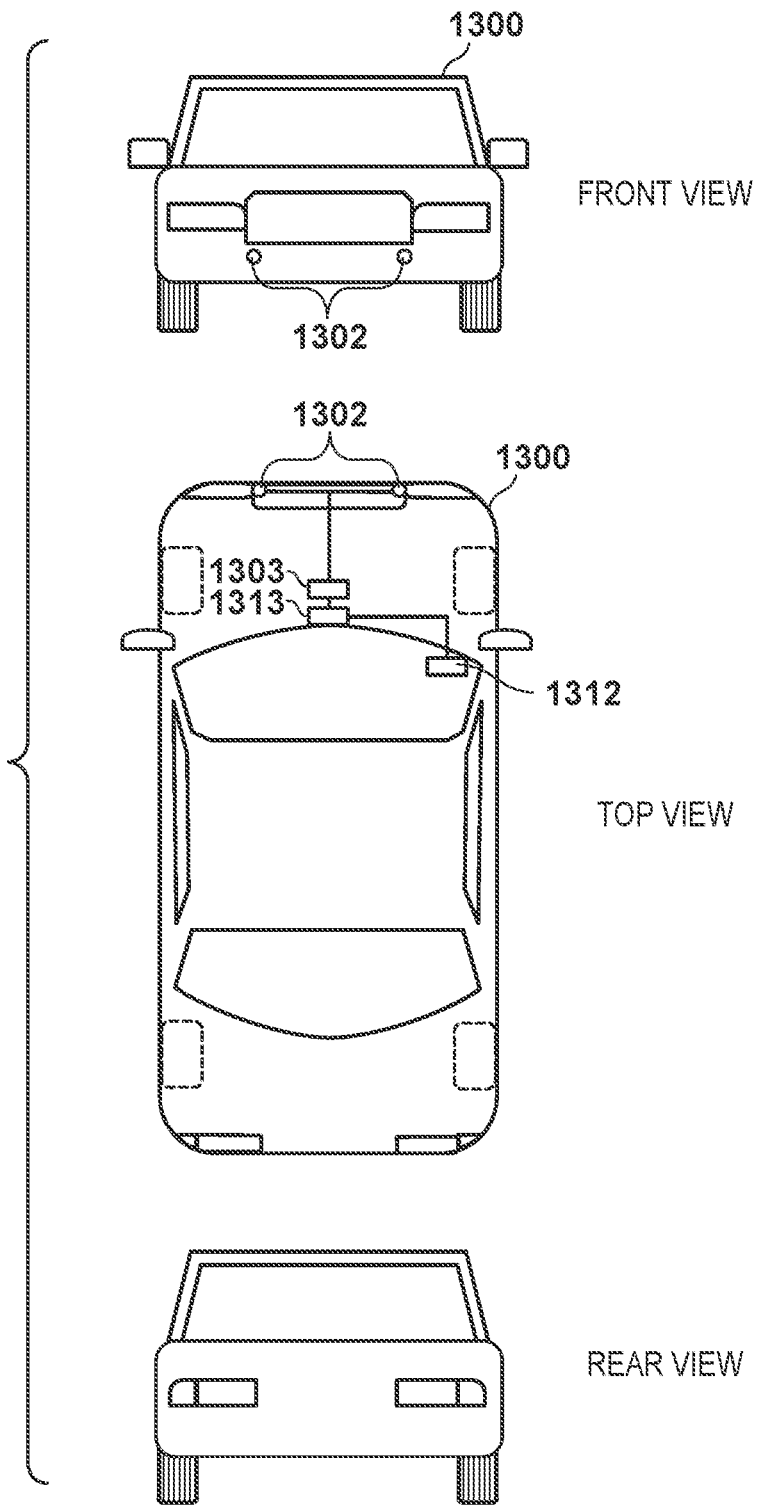

A photoelectric conversion system and a moving body according to this embodiment will be described with reference to FIGS. 16A and 16B. FIGS. 16A and 16B show examples of a vehicle system and a photoelectric conversion system that is incorporated in the vehicle system and performs image capturing. A photoelectric conversion system 1301 includes a photoelectric converter 1302, an image preprocessor 1315, an integrated circuit 1303, and an optical system 1314. The optical system 1314 forms an optical image of an object on the photoelectric converter 1302. The photoelectric converter 1302 converts, into an electrical signal, the optical image of the object formed by the optical system 1314. The photoelectric converter 1302 is the above-described photoelectric converter 1. The image preprocessor 1315 performs predetermined signal processing for the signal output from the photoelectric converter 1302. The function of the image preprocessor 1315 may be incorporated in the photoelectric converter 1302. In the photoelectric conversion system 1301, at least two sets of the optical systems 1314, the photoelectric converters 1302, and the image preprocessors 1315 are arranged, and an output from the image preprocessor 1315 of each set is input to the integrated circuit 1303.

The integrated circuit 1303 is an image capturing system application specific integrated circuit, and includes an image processor 1304 with a memory 1305, an optical distance measurement unit 1306, a distance measurement calculation unit 1307, an object recognition unit 1308, and an abnormality detection unit 1309. The image processor 1304 performs image processing such as development processing and defect correction for the output signal from each image preprocessor 1315. The memory 1305 temporarily stores a captured image, and stores the position of a defect in the captured image. The optical distance measurement unit 1306 performs focusing or distance measurement of an object. The distance measurement calculation unit 1307 calculates distance measurement information from a plurality of image data acquired by the plurality of photoelectric converters 1302. The object recognition unit 1308 recognizes objects such as a vehicle, a road, a road sign, and a person. Upon detecting an abnormality of the photoelectric converter 1302, the abnormality detection unit 1309 notifies a main control unit 1313 of the abnormality.

The integrated circuit 1303 may be implemented by dedicated hardware, a software module, or a combination thereof. Alternatively, the integrated circuit may be implemented by an FPGA (Field Programmable Gate Array), an ASIC (Application Specific Integrated Circuit), or a combination thereof.

The main control unit 1313 comprehensively controls the operations of the photoelectric conversion system 1301, vehicle sensors 1310, a control unit 1320, and the like. A method in which the photoelectric conversion system 1301, the vehicle sensors 1310, and the control unit 1320 each individually include a communication interface and transmit/receive control signals via a communication network (for example, CAN standards) may be adopted without providing the main control unit 1313.

The integrated circuit 1303 has a function of transmitting a control signal or a setting value to each photoelectric converter 1302 by receiving the control signal from the main control unit 1313 or by its own control unit.

The photoelectric conversion system 1301 is connected to the vehicle sensors 1310 and can detect the traveling state of the self-vehicle such as the vehicle speed, the yaw rate, and the steering angle, the external environment of the self-vehicle, and the states of other vehicles and obstacles. The vehicle sensors 1310 also serve as a distance information acquisition unit that acquires distance information to a target object. Furthermore, the photoelectric conversion system 1301 is connected to a driving support control unit 1311 that performs various driving support operations such as automatic steering, adaptive cruise control, and anti-collision function. More specifically, with respect to a collision determination function, based on the detection results from the photoelectric conversion system 1301 and the vehicle sensors 1310, a collision with another vehicle or an obstacle is estimated or the presence/absence of a collision is determined. This performs control to avoid a collision when the collision is estimated or activates a safety apparatus at the time of a collision.

Furthermore, the photoelectric conversion system 1301 is also connected to an alarm device 1312 that generates an alarm to the driver based on the determination result of a collision determination unit. For example, if the determination result of the collision determination unit indicates that the possibility of a collision is high, the main control unit 1313 performs vehicle control to avoid a collision or reduce damage by braking, releasing the accelerator pedal, or suppressing the engine output. The alarm device 1312 sounds an alarm such as a sound, displays alarm information on the screen of a display unit such as a car navigation system or a meter panel, applies a vibration to the seat belt or a steering wheel, thereby giving an alarm to the user.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-016891, filed Feb. 4, 2021, which is hereby incorporated by reference herein in its entirety.

What is claimed is:

1. A photoelectric converter comprising a structure in which a first substrate and a second substrate are stacked,
   wherein a pixel array including a plurality of pixels is arranged on the first substrate, and at least part of a plurality of sample-and-hold circuits, each including (1) a first sample-and-hold circuit configured to sample and hold a noise level of a selected pixel of the pixel array, (2) a second sample-and-hold circuit configured to sample and hold an optical signal of the selected pixel, and (3) a resistive element configured to generate a difference current corresponding to a difference between the noise level and the optical signal, is arranged on the first substrate,
   wherein at least part of a delta-sigma AD converter configured to convert the difference current output from the plurality of sample-and-hold circuits into a digital signal is arranged on the second substrate,
   wherein the difference current generated by the element of each of the plurality of sample-and-hold circuits is supplied from the first substrate to the second substrate, and
   wherein the delta-sigma AD converter includes a decimation filter which is not arranged on the first substrate such that the resistive element and the decimation filter are arranged on different substrates.

2. The photoelectric converter according to claim 1, wherein the delta-sigma AD converter further includes a delta-sigma modulator, and
   wherein the delta-sigma modulator and the decimation filter are arranged on the second substrate.

3. The photoelectric converter according to claim 1, wherein the overall delta-sigma AD converter is arranged on the second substrate.

4. The photoelectric converter according to claim 1, wherein the delta-sigma AD converter further includes a delta-sigma modulator,
   wherein the delta-sigma modulator is arranged on the first substrate, and
   wherein the decimation filter is arranged on the second substrate.

5. The photoelectric converter according to claim 4, wherein a maximum voltage supplied to the decimation filter arranged on the second substrate is lower than a maximum voltage supplied to the pixel array arranged on the first substrate.

6. The photoelectric converter according to claim 1, wherein the delta-sigma AD converter further includes a delta-sigma modulator,
   wherein the delta-sigma modulator includes a subtracter, an integrator, a quantizer, and a digital-analog converter,
   wherein the subtracter, the integrator, and the digital-analog converter are arranged on the first substrate, and
   wherein the quantizer and the decimation filter are arranged on the second substrate.

7. The photoelectric converter according to claim 6, wherein a maximum voltage supplied to the quantizer and the decimation filter which are arranged on the second substrate is lower than a maximum voltage supplied to the subtracter, the integrator, and the digital-analog converter which are arranged on the first substrate.

8. The photoelectric converter according to claim 1, wherein the delta-sigma AD converter further includes a delta-sigma modulator, and
   wherein the delta-sigma modulator includes (1) a first integrator configured to integrate a current supplied to an input node of the delta-sigma AD modulator, (2) a voltage-current converter configured to convert a voltage of the input node into a current, (3) a second integrator configured to integrate a current supplied to an intermediate node connected to an output of the voltage-current converter, (4) a quantizer configured to quantize a voltage of the intermediate node, (5) a first digital-analog converter configured to extract a predetermined current from the input node in accordance with an output from the quantizer, and (6) a second digital-analog converter configured to extract a predetermined current from the intermediate node in accordance with the output from the quantizer.

9. The photoelectric converter according to claim 8, wherein the decimation filter and at least part of the circuit including the first integrator, the voltage-current converter, the second integrator, the quantizer, the first digital-analog converter, and the second digital-analog converter are arranged on the second substrate.

10. The photoelectric converter according to claim 8, further comprising a current generation unit configured to generate a current corresponding to the analog signal output from the plurality of sample-and-hold circuits,
    wherein the first integrator integrates the current generated by the current generation unit.

11. The photoelectric converter according to claim 10, wherein the current generation unit is arranged on the first substrate.

12. The photoelectric converter according to claim 1, wherein the delta-sigma AD converter further includes a delta-sigma modulator,
    wherein the delta-sigma modulator includes a first subtracter, a first integrator, a second subtracter, a second integrator, a quantizer, a first digital-analog converter, and a second digital-analog converter,
    wherein the first subtracter outputs a difference between a signal supplied to the delta-sigma AD converter and an output from the first digital-analog converter, wherein the first integrator integrates the output from the first subtracter, wherein the second subtracter outputs a difference between an output from the first integrator and an output from the second digital-analog converter, wherein the second integrator integrates the output from the second subtracter, wherein the quantizer quantizes an output from the second integrator, and wherein the first digital-analog converter and the second digital-analog converter DA-convert an output from the quantizer.

13. The photoelectric converter according to claim 12, wherein the decimation filter and at least part of the circuit including the first subtracter, the first integrator, the second subtracter, the second integrator, the quantizer, the first digital-analog converter, and the second digital-analog converter are arranged on the second substrate.

14. The photoelectric converter according to claim 1, wherein one kind of power supply voltage is supplied to the second substrate.

15. The photoelectric converter according to claim 1, wherein part of the plurality of sample-and-hold circuits is arranged on the second substrate.

16. The photoelectric converter according to claim 1, wherein the second substrate includes at least one of a memory and a processor configured to process an output from the delta-sigma AD converter.

17. The photoelectric converter according to claim 1, wherein a pad configured to be supplied with a power supply voltage and a ground voltage is arranged on the first substrate and is not arranged on the second substrate.

18. The photoelectric converter according to claim 1, wherein a pad configured to be supplied with a power supply voltage and a ground voltage is arranged on the second substrate and is not arranged on the first substrate.

19. A photoelectric conversion system comprising:

the photoelectric converter according to claim 1; and a signal processor configured to process a signal output from the photoelectric converter.

20. A moving body comprising:

the photoelectric converter according to claim 1; and a signal processor configured to process a signal output from the photoelectric converter.

* * * * *